United States Patent
Sato

(10) Patent No.: US 9,252,567 B2
(45) Date of Patent: Feb. 2, 2016

(54) SURFACE-EMITTING LASER ELEMENT, ATOMIC OSCILLATOR, AND SURFACE-EMITTING LASER ELEMENT TESTING METHOD

(75) Inventor: Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 94 days.

(21) Appl. No.: 14/002,882

(22) PCT Filed: Mar. 14, 2012

(86) PCT No.: PCT/JP2012/057250
§ 371 (c)(1),
(2), (4) Date: Sep. 3, 2013

(87) PCT Pub. No.: WO2012/124821
PCT Pub. Date: Sep. 20, 2012

(65) Prior Publication Data
US 2013/0335155 A1    Dec. 19, 2013

(30) Foreign Application Priority Data

Mar. 17, 2011  (JP) ................................ 2011-059137
Nov. 22, 2011  (JP) ................................ 2011-255532

(51) Int. Cl.
*H01S 5/42*  (2006.01)
*B82Y 20/00*  (2011.01)
(Continued)

(52) U.S. Cl.
CPC . *H01S 5/42* (2013.01); *B82Y 20/00* (2013.01); *G04F 5/145* (2013.01);
(Continued)

(58) Field of Classification Search
CPC ...................................................... H01S 5/183

USPC ........................................................ 331/94.1, 3
See application file for complete search history.

(56) References Cited

U.S. PATENT DOCUMENTS 5,633,886 A   5/1997   Ramdani et al.
5,923,691 A   7/1999   Sato
(Continued)

FOREIGN PATENT DOCUMENTS

CN   1871751    11/2006
JP   7-211986    8/1995
(Continued)

OTHER PUBLICATIONS

International Search Report Issued on Jun. 26, 2012 in PCT/JP2012/057250 filed on Mar. 14, 2012.
(Continued)

*Primary Examiner* — Joseph Chang
(74) *Attorney, Agent, or Firm* — Cooper & Dunham LLP

(57) ABSTRACT

A disclosed surface-emitting laser element includes a lower DBR formed on a substrate, an active layer formed on the lower DBR, an upper DBR formed on the active layer, a wavelength-adjusting layer formed above the active layer, and a plurality of surface-emitting lasers configured to emit respective laser beams having different wavelengths by changing a thickness of the wavelength-adjusting layer. In the surface-emitting laser element, the wavelength-adjusting layer includes one of a first film having alternately layered GaInP and GaAsP and a second film having alternately layered GaInP and GaAs, the thickness of the wavelength-adjusting layer being changed by partially removing each of the alternating layers of a corresponding one of the first and second films.

19 Claims, 12 Drawing Sheets

(51) Int. Cl.
*G04F 5/14* (2006.01)
*H01S 5/343* (2006.01)
*H03B 17/00* (2006.01)
*H01S 5/183* (2006.01)
*H01S 5/40* (2006.01)
*H01S 5/00* (2006.01)

(52) U.S. Cl.
CPC ........ *H01S 5/18358* (2013.01); *H01S 5/34313* (2013.01); *H01S 5/423* (2013.01); *H03B 17/00* (2013.01); *H01S 5/0042* (2013.01); *H01S 5/18311* (2013.01); *H01S 5/18341* (2013.01); *H01S 5/18369* (2013.01); *H01S 5/4087* (2013.01)

(56) References Cited

U.S. PATENT DOCUMENTS

| | | | |
|---|---|---|---|
| 5,939,733 A | 8/1999 | Sato | |
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |
| 6,259,121 B1 * | 7/2001 | Lemoff et al. | 257/88 |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Kaminishi et al. | |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 7,957,444 B2 | 6/2011 | Itoh et al. | |
| 7,978,739 B2 | 7/2011 | Sugawara et al. | |
| 7,981,700 B2 | 7/2011 | Sato et al. | |
| 8,035,676 B2 | 10/2011 | Harasaka et al. | |
| 8,111,725 B2 | 2/2012 | Ishii et al. | |
| 8,179,414 B2 | 5/2012 | Sato et al. | |
| 8,208,511 B2 | 6/2012 | Sato et al. | |
| 8,416,822 B2 | 4/2013 | Shouji et al. | |
| 8,421,837 B2 | 4/2013 | Itoh et al. | |
| 8,441,511 B2 | 5/2013 | Harasaka et al. | |
| 8,483,254 B2 | 7/2013 | Harasaka et al. | |
| 2002/0094589 A1 | 7/2002 | Chirovsky et al. | |
| 2002/0097771 A1 | 7/2002 | Hwang et al. | |
| 2002/0191656 A1 | 12/2002 | Mawst et al. | |
| 2004/0114645 A1 | 6/2004 | Wang et al. | |
| 2007/0146085 A1 | 6/2007 | Koyama | |
| 2008/0055672 A1 | 3/2008 | Watanabe et al. | |
| 2009/0295902 A1 | 12/2009 | Sato et al. | |
| 2010/0060712 A1 | 3/2010 | Sato et al. | |
| 2010/0148879 A1 | 6/2010 | Koyama | |
| 2010/0328747 A1 | 12/2010 | Jikutani et al. | |
| 2011/0037825 A1 | 2/2011 | Jikutani et al. | |
| 2011/0116147 A1 | 5/2011 | Motomura et al. | |
| 2011/0128343 A1 | 6/2011 | Sato et al. | |
| 2011/0170155 A1 | 7/2011 | Jikutani et al. | |
| 2011/0176122 A1 | 7/2011 | Kaminishi et al. | |
| 2011/0228035 A1 | 9/2011 | Ishii et al. | |
| 2011/0261850 A1 | 10/2011 | Shouji et al. | |
| 2011/0304684 A1 | 12/2011 | Numata et al. | |

FOREIGN PATENT DOCUMENTS

| | | |
|---|---|---|
| JP | 09-135051 | 5/1997 |
| JP | 2751814 | 5/1998 |
| JP | 11-330631 | 11/1999 |
| JP | 2000-058958 | 2/2000 |
| JP | 2000-244067 | 9/2000 |
| JP | 2001-053380 | 2/2001 |
| JP | 2007-178274 | 7/2007 |
| JP | 2008-053353 | 3/2008 |
| JP | 2008-283129 | 11/2008 |
| JP | 2009-188598 | 8/2009 |
| WO | WO2002/47128 A1 | 6/2002 |

OTHER PUBLICATIONS

S. Knappe et al., "A microfabricated atomic clock", Applied Physics Letters, vol. 85, pp. 1460-1462 (2004).

S. Knappe, "MEMS Atomic Clocks", Comprehensive Microsystems, vol. 3, pp. 571-612.

D. K. Serkland et al., "VCSELs for Atomic Clocks", Proc. of SPIE vol. 6132 613208-1 (2006).

European Search Report dated Sep. 18, 2014 in corresponding European patent application No. 12 75 7716.1.

Shin, Jae-Heon et al., "Fabrication Method for Multiple Wavelength Vertical-Cavity Emitter Arrays by SiNx Layer Thickness Control", IEEE Photonics Technology Letters, vol. 11, No. 5, May 1, 1999, p. 509-511.

Chinese official action dated Jul. 20, 2015 (and English translation thereof) in corresponding Chinese Patent Application No. 201280013197.1.

Japanese official action dated Aug. 9, 2015 in corresponding Japanese Patent Application No. 2011-06227.

* cited by examiner

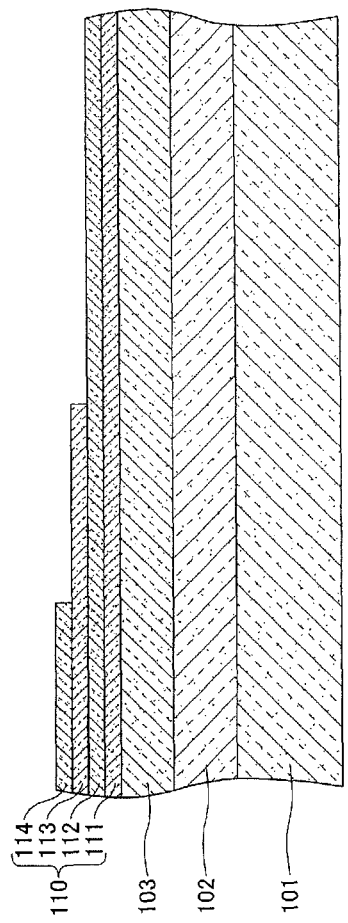
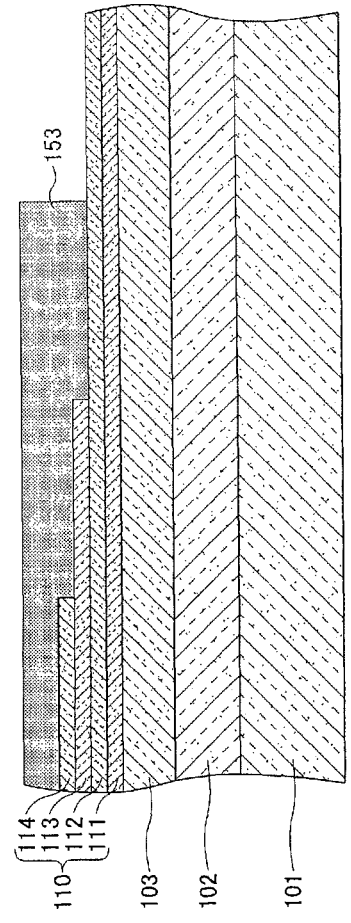
FIG.5B
FIG.5C

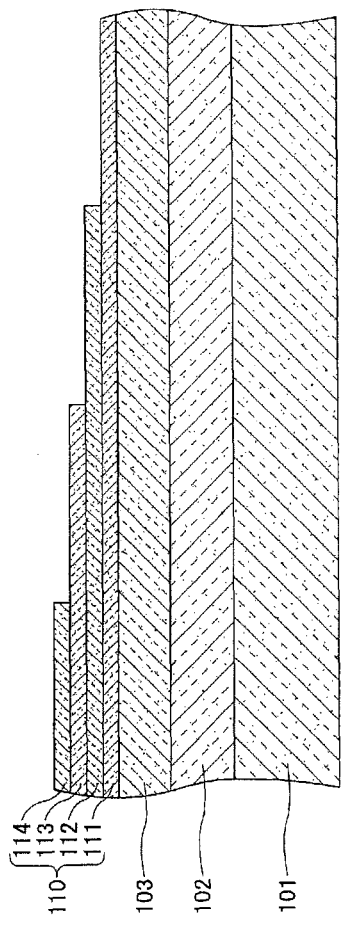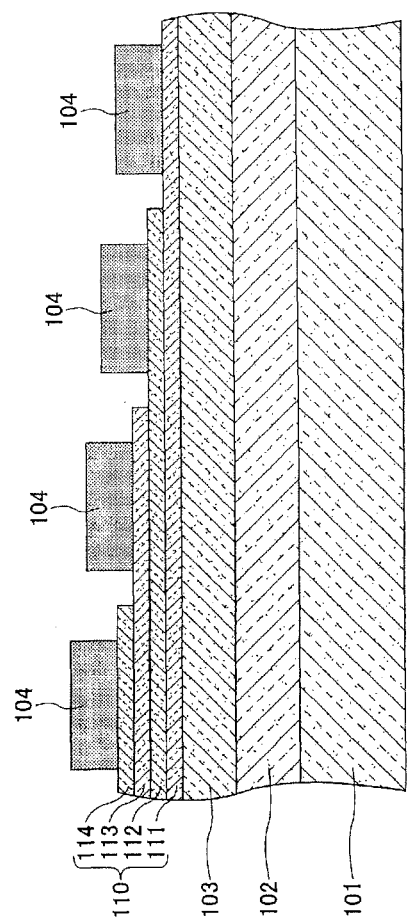
FIG.6A
FIG.6B

SURFACE-EMITTING LASER ELEMENT, ATOMIC OSCILLATOR, AND SURFACE-EMITTING LASER ELEMENT TESTING METHOD

TECHNICAL FIELD

The disclosures herein generally relate to a surface-emitting laser element, an atomic oscillator, and a method for testing the surface-emitting laser element.

BACKGROUND ART

A vertical cavity surface-emitting laser (VCSEL) is a semiconductor laser emitting a light beam perpendicular from the top of its substrate surface. Compared to a typical edge-emitting semiconductor laser, the VCSEL may have several advantageous characteristics such as a low price, low power consumption, compact and high performance, and easy to integrate two dimensionally.

A typical surface-emitting laser includes a resonator structure having a resonator region with an active layer, and an upper reflector and a lower reflector respectively at an upper part and a lower part of the resonator region (e.g., Patent Document 1). In the aforementioned surface-emitting laser, the resonator region is formed in a predetermined optical thickness in order to acquire an oscillation wavelength $\lambda$. With this configuration, a light beam oscillates at the oscillation wavelength $\lambda$ in the resonator region. In the aforementioned surface-emitting laser, the upper and lower reflectors are formed of materials with mutually different refractive indices which are alternately layered. That is, a material with a low refractive index (low refractive material) and a material with a high refractive index (high refractive material) are alternately layered such that the low refractive material and the high refractive material have an optical thickness of $\lambda/4$. With this configuration, the low refractive material and the high refractive material may be able to acquire high reflectance at the wavelength $\lambda$. Alternatively, there is proposed a surface-emitting laser formed of elements having different wavelengths within a chip (e.g., Patent Documents 2 to 4, and 6).

In the meantime, there is disclosed an atomic clock (atomic oscillator) that is capable of providing an extremely accurate time, and a technology for reducing the size of the atomic clock has been extensively studied. The atomic clock is an oscillator that oscillates based on transition energy of electrons in alkali metal atoms. Specifically, the transition energy of electrons in alkali metal atoms without disturbance is capable of acquiring extremely accurate values, and hence atomic oscillators may acquire several digits higher frequency stability compared to quartz oscillators.

There are several types of atomic clocks; however, a coherent population trapping (CPT) based atomic clock, among other types, may have three digits higher frequency stability compared to the quartz oscillator, and may, in future, be formed in ultra-compact size and consume ultra-low electric power (e.g., Non-Patent Documents 1 and 2, Patent Document 5).

FIG. 1 illustrates a structure of a CPT-based atomic clock. As illustrated in FIG. 1, the CPT-based atomic clock includes a laser element 910, a cell 940 configured to encapsulate alkali metal, and a receiving element 950 configured to receive a laser beam having passed through the cell 940. The CPT-based atomic clock having such a configuration modulates the laser beam and simultaneously transitions and excites two electrons in alkali metal atoms with sidebands appearing two sides of a carrier wave having a specific wavelength. The transition energy remains unchanged. When wavelengths of the sidebands match the wavelength of the transition energy, a clearing response that reduces optical absorption in the alikali metal may occur. Thus, in the CPT-based atomic oscillator, the wavelength of the carrier wave is adjusted such that the optical absorption is reduced in the alikali metal while a signal detected by the receiving element 950 is fed back to the modulator 960 and hence the modulator 960 adjusts the modulation frequency of the laser beam emitted from the laser 910. Note that in the CPT-based atomic clock, the laser beam emitted from the laser element 910 is applied to the cell 940 encapsulating the alkali metal via a $\lambda/4$ wavelength plate 930.

As a light source for such an ultra-compact atomic clock, a surface-emitting laser having an ultra-compact size, exhibiting ultra-low electric consumption power and high wavelength quality may be preferable. Further, as the light source for the ultra-compact atomic clock, the carrier wave exhibiting high wavelength accuracy of ±1 nm with respect to the specific wavelength (e.g., Non-Patent Document 3).

RELATED ART DOCUMENT

Patent Document 1: Japanese Laid-open Patent Publication No. 2008-53353
Patent Document 2: Japanese Laid-open Patent Publication No. 2000-58958
Patent Document 3: Japanese Laid-open Patent Publication No. 11-330631
Patent Document 4: Japanese Laid-open Patent Publication No. 2008-283129
Patent Document 5: Japanese Laid-open Patent Publication No. 2009-188598
Patent Document 6: Japanese Patent No. 2751814
Non-patent Document 1: Applied Physics Letters, Vol. 85, pp. 1460-1462 (2004)
Non-patent Document 2: Comprehensive Microsystems, vol. 3, pp. 571-612
Non-patent Document 3: Proc. of SPIE Vol. 6132 613208-1 (2006)

However, due to adverse effects of variability in growth rates during fabricating semiconductor layers and variability in uniformity of film thicknesses, it appears to be difficult to fabricate a large amount of the surface-emitting lasers oscillating at the same wavelength, and maintain the reproducibility and the uniformity of the fabricated surface-emitting lasers. Specifically, the semiconductor layers deposited by a metal organic chemical vapor deposition (MOCVD) device or a molecular beam epitaxy (MBE) device have the thickness uniformity of approximately 1 to 2%. If those semiconductor layers are deposited in the same film thickness by the MOCVD or MBE device) as those of the semiconductor layers oscillating at the wavelength of 850 nm, they may have surface distribution of 8.5 to 17 nm. Thus, if the semiconductor layers exhibiting the surface distribution of ±1 nm with respect to the wavelength are required, the fabrication cost may be raised due to their low yield rates.

SUMMARY OF THE INVENTION

It is a general object of at least one embodiment of a surface-emitting laser element, an atomic oscillator, and a method for testing the surface-emitting laser element that substantially eliminates one or more problems caused by the limitations and disadvantages of the related art.

According to one embodiment, there is provided a surface-emitting laser element that includes a lower DBR formed on a substrate; an active layer formed on the lower DBR; an upper DBR formed on the active layer; a wavelength-adjusting layer formed above the active layer; and a plurality of surface-emitting lasers configured to emit respective laser beams having different wavelengths by changing a thickness of the wavelength-adjusting layer. In the surface-emitting laser element, the wavelength-adjusting layer includes one of a first film having alternately layered GaInP and GaAsP and a second film having alternately layered GaInP and GaAs, the thickness of the wavelength-adjusting layer being changed by partially removing each of the alternating layers of a corresponding one of the first and second films.

According to another embodiment, there is provided a surface-emitting laser element that includes a lower DBR formed on a substrate; an active layer formed on the lower DBR; an upper DBR formed on the active layer; a wavelength-adjusting layer formed above the active layer; and a plurality of surface-emitting lasers configured to emit respective laser beams having different wavelengths by changing a thickness of the wavelength-adjusting layer; a contact layer formed between the active layer and the wavelength-adjusting layer; and an electrode connected to the contact layer.

According to another embodiment, there is provided an atomic oscillator that includes the surface-emitting laser elements; an alkali metal cell encapsulating alkali metal; and a photodetector configured to detect light beams having passed through the alkali metal cell, the light beams applied to the alkali metal cell being emitted from the surface-emitting lasers of the surface-emitting laser element. In the atomic oscillator, the light beams emitted from the surface-emitting lasers include sidebands and two of the light beams that have different wavelengths are applied to the alkali metal cell such that an oscillation frequency is controlled by light absorption properties due to a quantum interference effect of two kinds of resonant light.

According to another embodiment, there is provided a method for testing a surface-emitting laser element for use in an atomic oscillator. The method includes causing a plurality of surface-emitting lasers of the surface-emitting laser element to sequentially emit laser beams based on an operation condition set in advance; measuring respective wavelengths of the laser beams emitted from the surface-emitting lasers; and selecting one of the surface-emitting lasers emitting a wavelength closest to a predetermined wavelength.

According to another embodiment, there is provided a method for testing a surface-emitting laser element for use in an atomic oscillator. The method includes estimating a wavelength interval for each of a plurality of surface-emitting lasers of the surface-emitting laser element based on a number of layers forming a wavelength-adjusting layer of the surface-emitting laser; causing one of the surface-emitting lasers of the surface-emitting laser element to emit a laser beam based on an operation condition set in advance; measuring a wavelength of the laser beam emitted from the surface-emitting laser; estimating respective wavelengths of a rest of the surface-emitting lasers based on the estimated wavelength intervals for the surface-emitting lasers and the measured wavelength of the surface-emitting laser; and selecting one of the surface-emitting lasers emitting a wavelength closest to a predetermined wavelength based on the measured or estimated wavelengths of the leaser beams emitted from the surface-emitting lasers.

BRIEF DESCRIPTION OF THE DRAWINGS

Other objects and further features of embodiments will be apparent from the following detailed description when read in conjunction with the accompanying drawings, in which:

FIGS. 5A, 5B and 5C are explanatory diagrams illustrating the method for fabricating the surface-emitting laser element according to the first embodiment;

FIGS. 6A and 6B are explanatory diagrams illustrating the method for fabricating the surface-emitting laser element according to the first embodiment;

BEST MODE OF CARRYING OUT THE INVENTION

Figure 1:
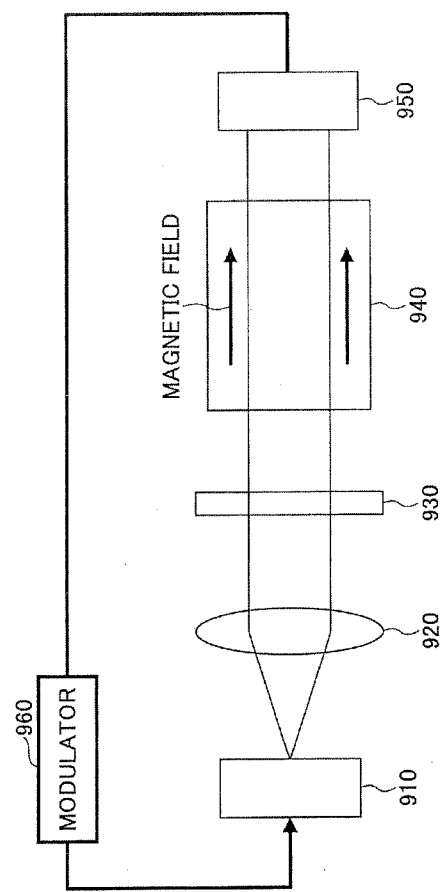
FIG. 1 is a structural diagram illustrating an atomic oscillator.

A description is given, with reference to the accompanying drawings, of embodiments of the present invention. Note that identical components are provided with the same reference numerals and repeated descriptions of the same components are omitted.

First Embodiment

Structure of Surface-Emitting Laser Element

Figure 2:
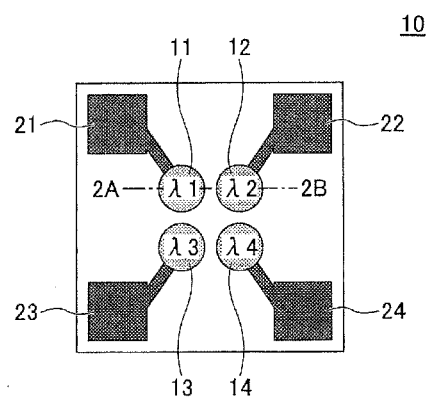
FIG. 2 is a top diagram illustrating a surface-emitting laser element according to a first embodiment.
Figure 3:
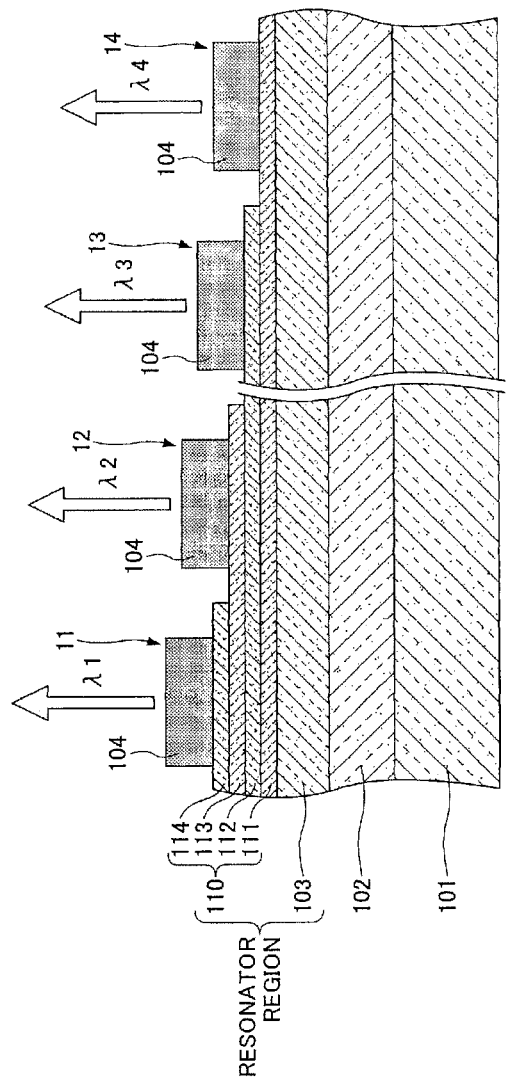
FIG. 3 is an explanatory diagram illustrating a surface-emitting laser element according to the first embodiment.

First, a first embodiment is described. As illustrated in FIGS. 2 and 3, a surface-emitting laser element 10 according to a first embodiment includes plural surface-emitting lasers, namely, a first surface-emitting laser 11, a second surface-emitting laser 12, a third surface-emitting laser 13 and a fourth surface-emitting laser 14. Note that FIG. 3 is a simplified diagram of the surface-emitting laser element 10, a contact layer or the like is omitted from the illustration for convenience.

In the surface-emitting laser element 10, the first surface-emitting laser 11, the second surface-emitting laser 12, the third surface-emitting laser 13 and the fourth surface-emitting laser 14 are respectively connected to electrode pads 21, 22, 23 and 24. Specifically, in the surface-emitting laser element 10, the first surface-emitting laser 11 is connected to the electrode pad 21, the second surface-emitting laser 12 is connected to the electrode pad 22, the third surface-emitting laser 13 is connected to the electrode pad 23 and the fourth surface-emitting laser 14 is connected to the electrode pad 24. Further, the first surface-emitting laser 11, the second surface-emitting laser 12, the third surface-emitting laser 13 and the fourth surface-emitting laser 14 have mutually different wavelengths of emitted laser beams. Specifically, the first surface-emitting laser 11 is configured to emit the laser beam having the wavelength $\lambda 1$, the second surface-emitting laser 12 is configured to emit the laser beam having the wavelength $\lambda 2$, the third surface-emitting laser 13 is configured to emit the laser beam having the wavelength $\lambda 3$ and the fourth surface-emitting laser 14 is configured to emit the laser beam having the wavelength $\lambda 4$ as illustrated in FIG. 2. The wavelengths $\lambda 1$ to $\lambda 4$ are different from one another.

Since the first surface-emitting laser 11 to the fourth surface-emitting laser 14 have the mutually different wavelengths of $\lambda 1$ to $\lambda 4$, a wavelength-adjusting layer 110 is formed between an active layer 103 and an upper DBR 104 in the surface-emitting laser element 10, as illustrated in FIG. 3. That is, in a structure having the lower DBR 102, the active layer 103, the wavelength-adjusting layer 110 and the upper DBR 104 formed in this order on a substrate 101, the wavelengths of the first surface-emitting laser 11 to the fourth surface-emitting laser 14 are determined based on respective thicknesses of resonator regions between the lower DBR 102 and the upper DBR 104. Accordingly, as illustrated in FIG. 3, since the resonator region is formed of the active layer 103 and the wavelength-adjusting layer 110, the thickness of the resonator region may be changed corresponding to the first surface-emitting laser 11 to the fourth surface-emitting laser 14. Thus, the first surface-emitting laser 11 to the fourth surface-emitting laser 14 may be able to emit the laser beams having the different wavelengths.

Specifically, the lower DBR 102 that is formed of alternately layered semiconductor materials having different refractive indices is formed on the substrate 101 that is formed of the semiconductor or the like, and the active layer 103 having a predetermined thickness is formed on the lower DBR. The wavelength-adjusting layer 110 having different thicknesses corresponding to the first surface-emitting semiconductor laser 11 to the fourth surface-emitting semiconductor laser 14 is formed on the active layer 103. The wavelength-adjusting layer 110 includes a first adjusting layer 111, a second adjusting layer 112, a third adjusting layer 113 and a fourth adjusting layer 114 layered in this order on the active layer 103. The first and the third adjusting layers 111 and 113 are made of the same material and the second and the fourth adjusting layers 112 and 114 are made of the same material. Specifically, one of the materials forming the first to the fourth adjusting layers is indium gallium phosphide (InGaP), and the other is gallium arsenide phosphide (GaAsP) or a gallium arsenide (GaAs). Note that the lower DBR 102, the active layer 103 and the wavelength-adjusting layer 110 are the semiconductor layers epitaxially grown on the substrate 101.

Note also that the upper DBRs 104 are formed on the wavelength-adjusting layer 110 corresponding to the first surface-emitting laser 11 to the fourth surface-emitting laser 14. The upper DBR 104 includes alternately layered dielectric films having a high refractive index and a low refractive index, which are composed of an oxide, a nitride and a fluoride. Note that in the first embodiment, the lower DBR 102 and the upper DBR 104 serve as a mirror, the lower DBR 102 and the upper DBR 104 may also be referred to as a lower reflector and an upper reflector, respectively.

Note that the wavelength-adjusting layer 110 corresponding to the first surface-emitting laser 11 is composed of the first adjusting layer 111, the second adjusting layer 112, the third adjusting layer 113 and the fourth adjusting layer 114, and the resonator region corresponding to the first surface-emitting laser 11 is composed of the first adjusting layer 111, the second adjusting layer 112, the third adjusting layer 113 and the fourth adjusting layer 114 and the active layer 103. Thus, the first surface-emitting laser 11 is configured to emit the laser beam having the wavelength $\lambda 1$ corresponding to the thickness of the resonator region in the first surface-emitting laser 11.

The wavelength-adjusting layer 110 corresponding to the second surface-emitting laser 12 is composed of the first adjusting layer 111, the second adjusting layer 112 and the third adjusting layer 113, and the resonator region corresponding to the second surface-emitting laser 12 is composed of the first adjusting layer 111, the second adjusting layer 112 and the third adjusting layer 113 and the active layer 103. Thus, the second surface-emitting laser 12 is configured to emit the laser beam having the wavelength $\lambda 2$ corresponding to the thickness of the resonator region in the second surface-emitting laser 12.

The wavelength-adjusting layer 110 corresponding to the third surface-emitting laser 13 is composed of the first adjusting layer 111 and the second adjusting layer 112, and the resonator region corresponding to the third surface-emitting laser 13 is composed of the first adjusting layer 111 and the second adjusting layer 112 and the active layer 103. Thus, the third surface-emitting laser 13 is configured to emit the laser beam having the wavelength $\lambda 3$ corresponding to the thickness of the resonator region in the third surface-emitting laser 13.

The wavelength-adjusting layer 110 corresponding to the fourth surface-emitting laser 19 is composed of the first adjusting layer 111, and the resonator region corresponding to the fourth surface-emitting laser 14 is composed of the first adjusting layer 111 and the active layer 103. Thus, the fourth surface-emitting laser 14 is configured to emit the laser beam having the wavelength $\lambda 4$ corresponding to the thickness of the resonator region in the fourth surface-emitting laser 14.

As described above, the plural surface-emitting lasers emitting the laser beams of the different wavelengths may be formed on the substrate 101 in the surface-emitting laser element according to the first embodiment. With this configuration, even if the thicknesses of the semiconductor layers fluctuate while fabricating the surface-emitting laser element, the semiconductor layer capable of emitting a laser beam with a desired wavelength may be obtained by selecting one of the first surface-emitting lasers 11 to the fourth surface-emitting laser 14 that is configured to emit a laser beam with the wavelength closest to the desired wavelength. Accordingly, the surface-emitting laser element having the surface-emitting laser capable of emitting at the desired wavelength may be fabricated at low cost.

Note that a method for testing the surface-emitting lasers element in order to select one of the surface-emitting lasers emitting a laser beam of a desired wavelength includes allowing all the surface-emitting lasers within the respective chips to sequentially emit laser beams based on a predetermined condition set for each of the chips, measuring the wavelengths of the laser beams emitted from the respective surface-emitting lasers, and selecting one of the surface-emitting lasers emitting the laser beam with the wavelength closest to the desired wavelength specifically set for the corresponding chip.

Further, the number of wavelength-adjusting layers is determined for each of the surface-emitting lasers. Hence, a desired one of the surface-emitting lasers may be selected by estimating intervals between the wavelengths of the surface-emitting lasers, measuring a wavelength of a specific one of the surface-emitting lasers within the chip and estimating the wavelengths of the rest of the surface-emitting lasers.

(Method for Forming Wavelength-Adjusting Layer in Surface-Emitting Laser Element)

Next, a method for forming the wavelength-adjusting layer in the surface-emitting laser element is described.

Figure 4A:
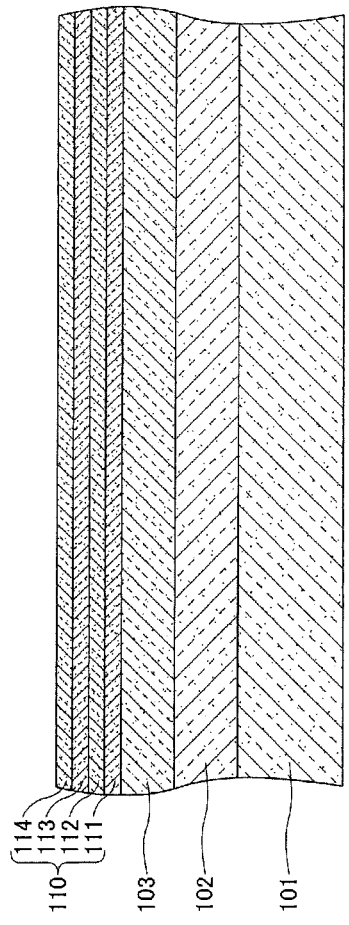
FIGS. 4A, 4B and 4C are explanatory diagrams illustrating a method for fabricating the surface-emitting laser element according to the first embodiment.

Initially, the lower DBR 102, the active layer 103, and the wavelength-adjusting layer 110 are made of semiconductor materials which are epitaxially grown on the substrate 101 by MOCVD or MBE, as illustrated in FIG. 4A. Note that the wavelength-adjusting layer 110 is formed by layering the first adjusting layer 111, the second adjusting layer 112, the third adjusting layer 113 and the fourth adjusting layer 114. Note that the first adjusting layer 111 and the third adjusting layer 113 are made of GaInP and the second adjusting layer 112 and the fourth adjusting layer 114 are made of GaAsP. In the first embodiment, the wavelength-adjusting layer 110 is formed such that an optical thickness of the resonator region is $3\lambda$ corresponding to an oscillation wavelength $\lambda$.

Figure 4B:
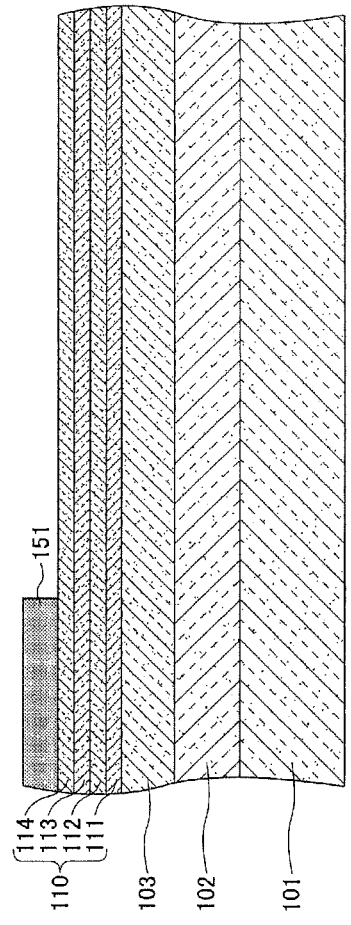

Next, as illustrated in FIG. 4B, a resist pattern 151 is formed in a region of the wavelength-adjusting layer 110 where the first surface-emitting laser 11 is formed. Specifically, a photoresist is applied to the fourth adjusting layer 114 of the wavelength-adjusting layer 110, and the applied photoresist is then exposed to light by an exposure device to thereby form the resist pattern 151 on the fourth adjusting layer 114 of the wavelength-adjusting layer 110.

Figure 4C:
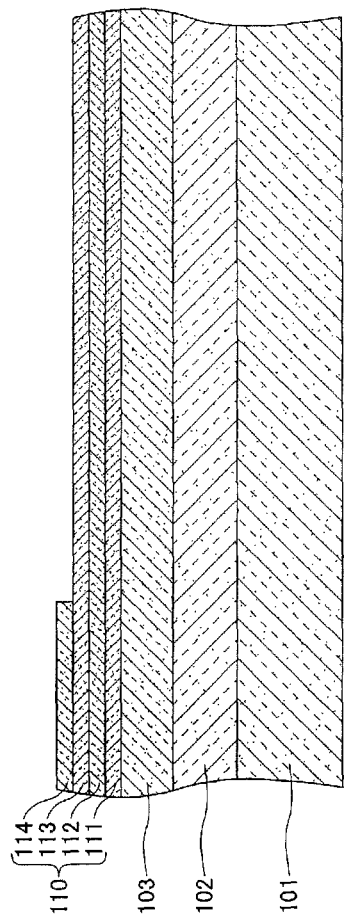

Next, as illustrated in FIG. 4C, a region of the fourth adjusting layer 114 in which the resist pattern 151 is not formed is removed by wet etching. Specifically, since the fourth adjusting layer 114 is made of GaAsP, the aforementioned region (where the resist pattern 151 is not formed) of the fourth adjusting layer 114 may be wet etched with a mixed solution of sulfuric acid, hydrogen peroxide and water. Thus, since only the region where the resist pattern 151 is not formed of the fourth adjusting layer 114 is removed, a surface of the third adjusting layer 113 is exposed from the removed region of the fourth adjusting layer 114. Note that the above mixed solution may remove (etch) the GaAsP forming the fourth adjusting layer 114 but may not etch (remove) the GaInP forming the third adjusting layer 113. The aforementioned mixed solution may hereinafter also be referred to as a "first etching solution". Thereafter, the resist pattern 151 is removed with an organic solvent, or the like.

Figure 5A:
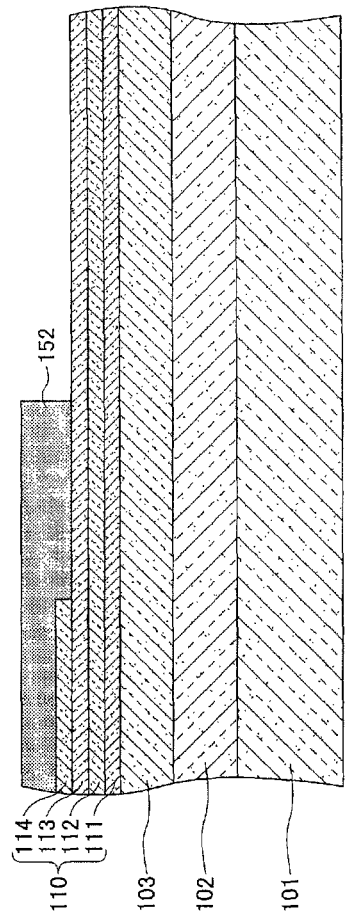

Next, as illustrated in FIG. 5A, a resist pattern 152 is formed in a region of the wavelength-adjusting layer 110 where the first surface-emitting laser 11 and the second surface-emitting laser 12 are formed. Specifically, a photoresist is applied to the fourth adjusting layer 114 and the third adjusting layer 113 of the wavelength-adjusting layer 110, and the applied photoresist is then exposed to light by the exposure device to thereby form the resist pattern 152.

Next, as illustrated in FIG. 5B, a region of the third adjusting layer 113 in which the resist pattern 152 is not formed is removed by wet etching. Specifically, since the third adjusting layer 113 is made of GaInP, the aforementioned region (where the resist pattern 152 is not formed) of the third adjusting layer 113 may be wet etched with a mixed solution of hydrochloric acid and water. Thus, since only the region where the resist pattern 152 is not formed of the third adjusting layer 113 is removed, a surface of the second adjusting layer 112 is exposed from the removed region of the third adjusting layer 113. Note that the above mixed solution may remove (etch) the GaInP forming the third adjusting layer 113 but may not etch (remove) the GaAsP forming the second adjusting layer 112. The aforementioned mixed solution may hereinafter also be referred to as a "second etching solution". Thereafter, the resist pattern 152 is removed with an organic solvent, or the like.

Next, as illustrated in FIG. 5C, a resist pattern 153 is formed in a region of the wavelength-adjusting layer 110 where the first surface-emitting laser 11, the second surface-emitting laser 12 and the third surface-emitting laser 13 are formed. Specifically, a photoresist is applied to the fourth adjusting layer 114, the third adjusting layer 113 and the second adjusting layer 112 of the wavelength-adjusting layer 110, and the applied photoresist is then exposed to light by the exposure device to thereby form the resist pattern 153.

Next, as illustrated in FIG. 6A, a region of the second adjusting layer 112 in which the resist pattern 153 is not formed is removed by wet etching. Specifically, the region of the second adjusting layer 112 in which the resist pattern 153 is not formed is wet etched with the first etching solution. Thus, since only the region where the resist pattern 153 is not formed of the second adjusting layer 112 is removed, a surface of the first adjusting layer 111 is exposed from the removed region of the second adjusting layer 112. Thereafter, the resist pattern 153 is removed with an organic solvent, or the like.

Next, as illustrated in FIG. 6B, the upper DBRs 104 are formed. Specifically, a dielectric film formed of a high refractive index material and a dielectric film formed of a low refractive index material, which are composed of an oxide, a nitride and a fluoride, are alternately layered in respective predetermined thicknesses to thereby form the upper DBRs 104.

As a result, the wavelength-adjusting layer 110 and the upper DBR 104 of the surface-emitting laser element according to the first embodiment may be formed.

In the first embodiment, unlike the technologies disclosed in Patent Documents 3 and 6, the first adjusting layer 111, the second adjusting layer 112, the third adjusting layer 113 and the fourth adjusting layer 114 that form the wavelength-adjusting layer 110 contain no aluminum (Al). Accordingly, the first adjusting layer 111, the second adjusting layer 112, the third adjusting layer 113 and the fourth adjusting layer 114 may be resistant to oxidation or the like and may be able to maintain their uniform surfaces after being etched. That is, Al is extremely susceptible to corrosion. Thus, if any one of the first adjusting layer 111, the second adjusting layer 112, the third adjusting layer 113 and the fourth adjusting layer 114 is formed of a material containing Al, the surface condition of such a wavelength-adjusting layer deteriorates after being wet etched. As a result, when the upper DBR 104 is formed on the wavelength-adjusting layer, the upper DBR 104 may easily come off from the surface of the wavelength-adjusting layer or the thickness of the resonator region may be non-uniform. However, in the surface-emitting laser element according to the first embodiment, the wavelength-adjusting layer 110 is formed of a material containing no Al, and hence, the wavelength-adjusting layer 110 may not be susceptible to corrosion. As a result, the upper DBR 104 may not easily come off from the surface of the wavelength-adjusting layer or the resonator region may maintain a uniform thickness even after the wavelength-adjusting layer has been etched in the surface-emitting laser element according to the first embodiment.

Further, in the surface-emitting laser element according to the first embodiment, the upper DBR formed on the wavelength-adjusting layer is formed of a dielectric material. If the upper DBR is formed by regrowing on the epitaxial wafer (i.e., wavelength-adjusting layer) which has already been processed in a similar manner as the technologies of Patent Documents 3 and 6, inferior surface smoothness or crystallinity in the steps of the regrown DBR layer may be observed. If the wavelength-adjusting layer contains Al, even further defects may be observed in the upper DBR due to oxidation. In contrast, in the surface-emitting laser element according to the first embodiment, the upper DBR is formed of the dielectric material. Accordingly, even if the upper DBR formed is on the wavelength-adjusting layer after the wavelength-adjusting layer has been processed, the upper DBR may not be adversely affected.

Further, in the surface-emitting laser element according to the first embodiment, the wavelength-adjusting layer 110 is formed by alternately depositing GaInP and GaAsP, and two kinds of etching solutions (i.e., first and second etching solutions), with which one of the GaInP and GaAsP layers will be wet etched while the other will not be wet etched. Accordingly, the surface of the wavelength-adjusting layer 110 that has been etched with the two kinds of the etching solutions may be formed in the predetermined thickness without having been overetched and hence may be able to maintain the surface smoothness. As a result, the surface-emitting laser element having stable properties may be fabricated. Further, since the GaAsP has tensile strain against the GaAs substrate, the GaInP may preferably include a composition exhibiting compression strain in view of tensile strain compensation.

(Surface-Emitting Laser Element)

Figure 7:
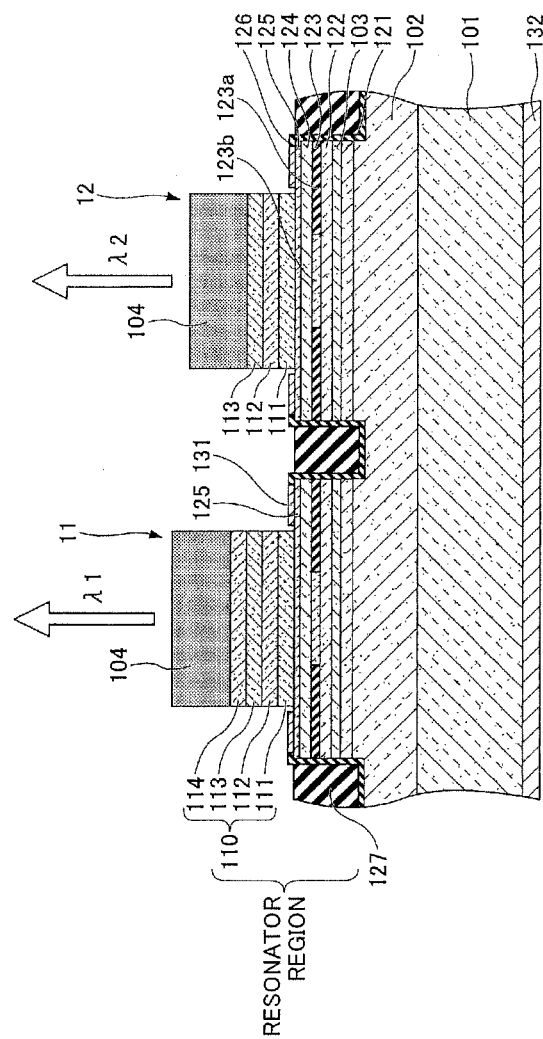
FIG. 7 is a structural diagram illustrating the surface-emitting laser element according to the first embodiment.

Next, the surface-emitting laser element according to the first embodiment is described in further detail. FIG. 7 is a cross-sectional diagram taken along a dash-dot line 2A-2B in FIG. 2. The surface-emitting laser element according to the first embodiment has an oscillation wavelength of 894.6 nm and includes a current constriction structure obtained by selectively oxidizing an aluminum arsenide (AlAs) layer forming a current constriction layer. Specifically, the surface-emitting laser element according to the first embodiment includes four surface-emitting lasers formed on a 300 μm square semiconductor chip (substrate). Since the surface-emitting laser element may be obtained by forming plural surface-emitting lasers formed in a narrow region, an emitting position may scarcely be changed by switching one emitting laser to another. Accordingly, optical axis adjustment or the like may not be required or the optical axis may be easily adjustable in the surface-emitting laser element. In view of the optical adjustment, it is preferable that the substrate be 500×500 μm.

In the surface-emitting laser element according to the first embodiment, the substrate 101 is formed of an n-GaAs substrate. The lower DBR 102 is formed by layering 35.5 pairs of a high refractive index layer made of n-$Al_{0.1}Ga_{0.9}As$ and a low refractive index layer made of n-$Al_{0.9}Ga_{0.1}As$ such that an optical thickness of each of the refractive index layers results in $\lambda/4$.

The active layer 103 having a GaInAs quantum well layer and a GaInPAs barrier layer is formed on the lower DBR 102 via a lower spacer layer 121 made of $Al_{0.2}Ga_{0.8}As$. A first upper spacer layer 122 made of $Al_{0.2}Ga_{0.8}As$, a current constriction layer 123 made of AlAs, a second upper spacer layer 124 made of $Al_{0.2}Ga_{0.8}As$ and a contact layer 125 made of p-GaAs are sequentially layered in this order on the active layer 103.

The wavelength-adjusting layer 110 composed of the first adjusting layer 111, the second adjusting layer 112, the third adjusting layer 113 and the fourth adjusting layer 114 is formed by alternately layering GaInP and GaAsP on the contact layer 125, and the parts corresponding to the respective (i.e., first to fourth) surface-emitting lasers are removed from a predetermined region of the wavelength-adjusting layer 110 as described above. Note that the lower DBR 102, the lower spacer layer 121, the active layer 103, the first upper spacer layer 122, the current constriction layer 123, the second upper spacer layer 124, the contact layer 125 and the wavelength-adjusting layer 110 are formed by epitaxially growing a semiconductor material utilizing MOCVD or MBE.

In the surface-emitting laser element according to the first embodiment, each of the surface-emitting lasers has a mesa structure, which is formed by etching the semiconductor layers between the later formed surface-emitting lasers. Each of the mesa structures is heat-treated with steam to oxidize the current constriction layer 123 from a periphery of the mesa structure. As a result, a selective oxidation region 123a (i.e., an oxidized region) corresponding to a peripheral part and a current constriction region 123b (i.e., non-oxidized region) corresponding to a central part are formed. That is, the current constriction layer 123 has a current constriction structure, which is formed of the oxidized selective oxidation region 123a and the non-oxidized current constriction region 123b. In the surface-emitting laser according to the first embodiment, each of the mesa structures viewed from the top has a round shape. However, the mesa structure may have an oval shape, a square shape or a rectangular shape.

Thereafter, a protection film 126 made of SiN is formed on the entire surface of the mesa structure. The protection film 126 is then removed from the upper part of the mesa structure including a region where an upper electrode 131 is formed. The upper DBR 104 is formed in a region of the wavelength-adjusting layer 110 corresponding to each of the surface-emitting lasers, from which the first, second, third or fourth adjusting layer is correspondingly removed, by layering 8.5 pairs of a high refractive index layer made of $TiO_2$ and a low refractive index layer made of $SiO_2$ such that an optical thickness of each of the refractive index layers results in $\lambda/4$. Note that the upper DBR 104 may be formed of a dielectric material obtained by layering the high refractive index layer and the low refractive index layer. Specific examples of the dielectric material include an oxide, a nitride and fluoride. Examples of the high refractive index layer include titanium dioxide ($TiO_2$), tantalum pentoxide ($Ta_2O_5$) and hafnium dioxide ($HfO_2$). Examples of the low refractive index layer include $SiO_2$ and magnesium fluoride ($MgF_2$).

Note that in the surface-emitting laser element according to the first embodiment, the wavelength-adjusting layer 110 and the upper DBR 104 are formed in a region narrower than a region where the contact layer 125 is formed corresponding to each of the surface-emitting lasers. That is, the wavelength-adjusting layer 110 and the upper DBR 104 are formed such that a surface of the contact layer 125 is partially exposed. Further, in the surface-emitting laser element according to the first embodiment, the resonator region is formed of the active layer 103, the wavelength-adjusting layer 110 and the like that are formed between the lower DBR 102 and the upper DBR 104. Note that several pairs of DBRs composed of semiconductor layers having different refractive indices may be formed between the active layer 103 and the contact layer 125 in order to acquire effects of the wavelength-adjusting layer 110.

Thereafter, the upper electrode 131 forming a p-side electrode may be formed. The upper electrode 131 is formed for each of the surface-emitting lasers and each of the upper electrodes 131 is connected to a corresponding one of electrode pads 21 to 24. Further, a lower electrode 132 forming an n-side electrode is formed on a rear surface of the substrate 101, and a trench between the adjacent mesa structures is filled with polyimide 127. Note that the lower electrode may not be limited to being formed on the rear surface of the substrate 101 to form an intracavity contact structure; however, the lower electrode may be formed in contact with the contact layer that is formed between the lower DBR 102 and the active layer 103.

The surface-emitting laser element according to the first embodiment is configured to emit laser beams of different wavelengths corresponding to the surface-emitting lasers in directions indicated by arrows. Further, the surface-emitting laser element according to the first embodiment has a function to improve reliability since the protection layer made of SiN covers an exposed Al side surface of the mesa structure while forming the mesa structure in the fabrication process.

In the surface-emitting laser element according to the first embodiment, the upper DBR 104 is formed by layering the dielectric films of different refractive indices. Accordingly, the surface-emitting laser element according to the first embodiment may have a refractive index difference allowance (range) larger than that of the surface-emitting laser element formed of the semiconductor materials of different refractive indices. Accordingly, the number of layers forming the upper DBR 104 may be reduced and hence, the thin upper DBR 104 may be formed.

Further, in the surface-emitting laser element according to the first embodiment, the contact layer 125 connected to the upper electrode 131 corresponding to each of the surface-emitting lasers is formed beneath the wavelength-adjusting layer 110. Thus, the surface-emitting laser element according to the first embodiment may be capable of passing an electric current through each of the surface-emitting lasers without being affected by the thicknesses of the wavelength-adjusting layer 110. That is, if the upper electrode 131 is formed on the wavelength-adjusting layer 110 such that the upper electrode 131 is brought directly into contact with the wavelength-adjusting layer 110, the materials to be contacted with the electrode 131 differ corresponding to the surface-emitting lasers. Accordingly, the contact resistance to the wavelength-adjusting layer 110 may differ between the surface-emitting lasers, or the amount of current to be passed through may also differ between the surface-emitting lasers. As a result, electric properties or emitting properties may largely differ between the surface-emitting lasers in the surface-emitting laser element. If the contact layer 125 is formed on the wavelength-adjusting layer 110 and the upper electrode 131 is formed on the contact layer 125, the electric resistance may be raised due to band discontinuity in each interface of the layers forming the wavelength-adjusting layer 110. In addition, since the number of interfaces differ between the surface-emitting lasers, the resistance value may differ between the surface-emitting lasers. However, in the surface-emitting laser element according to the first embodiment, the upper electrode 131 is connected to the contact layer 125 formed beneath the wavelength-adjusting layer 110. Thus, the above disadvantageous effects may be prevented in the surface-emitting laser element according to the first embodiment.

Second Embodiment

Next, a second embodiment is described. A surface-emitting laser element 200 according to a second embodiment is described with reference to FIG. 8. The surface-emitting laser element 200 according to the second embodiment includes eight surface-emitting lasers formed on a substrate 201 and is configured to emit laser beams of different wavelengths corresponding to the surface-emitting lasers.

Specifically, the surface-emitting laser element 200 according to the second embodiment includes a first surface-emitting laser 211, a second surface-emitting laser 212, a third surface-emitting laser 213, a fourth surface-emitting laser 214, a fifth surface-emitting laser 215, a sixth surface-emitting laser 216, a seventh surface-emitting laser 217 and an eighth surface-emitting laser 218 formed on the substrate 201. The first surface-emitting laser 211 to the eighth surface-emitting laser 218 are connected to respective electrode pads. Specifically, in the surface-emitting laser element 200, the first surface-emitting laser 211 is connected to an electrode pad 221, the second surface-emitting laser 212 is connected to an electrode pad 222, the third surface-emitting laser 213 is connected to an electrode pad 223, the fourth surface-emitting laser 214 is connected to an electrode pad 224, the fifth surface-emitting laser 215 is connected to an electrode pad 225, the sixth surface-emitting laser 216 is connected to an electrode pad 226, the seventh surface-emitting laser 217 is connected to an electrode pad 227 and the eighth surface-emitting laser 218 is connected to an electrode pad 228.

Figure 8:
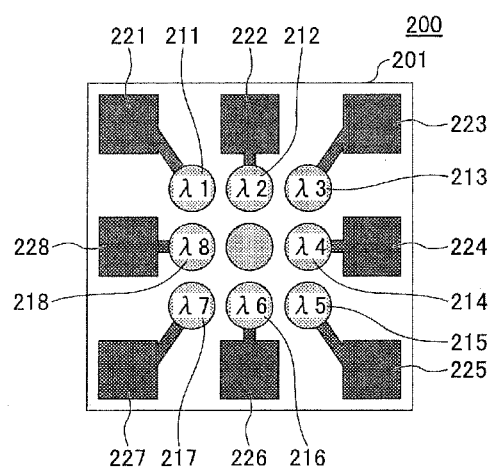
FIG. 8 is a top diagram illustrating a surface-emitting laser element according to a second embodiment.

The first surface-emitting laser 211 to the eighth surface-emitting laser 218 emit laser beams of mutually different wavelengths. Specifically, the first surface-emitting laser 211 is configured to emit the laser beam having the wavelength $\lambda 1$, the second surface-emitting laser 212 is configured to emit the laser beam having the wavelength $\lambda 2$, the third surface-emitting laser 213 is configured to emit the laser beam having the wavelength $\lambda 3$, the fourth surface-emitting laser 214 is configured to emit the laser beam having the wavelength $\lambda 4$, the fifth surface-emitting laser 215 is configured to emit the laser beam having the wavelength $\lambda 5$, the sixth surface-emitting laser 216 is configured to emit the laser beam having the wavelength $\lambda 6$, the seventh surface-emitting laser 217 is configured to emit the laser beam having the wavelength $\lambda 7$ and the eighth surface-emitting laser 218 is configured to emit the laser beam having the wavelength $\lambda 8$, as illustrated in FIG. 8. The wavelengths $\lambda 1$ to $\lambda 8$ are different from one another. In the surface-emitting laser element 200 according to the second embodiment, the wavelength-adjusting layer is formed such that the thicknesses of the wavelength-adjusting layer is changed (adjusted) corresponding to the surface-emitting lasers to emit laser beams of different wavelengths. The number of adjusting layers forming the wavelength-adjusting layer is increased in the surface-emitting laser element 200 according to the second embodiment. Note that the size of each of the electrode pads 221 to 228 is an approximately 50 µm square and the substrate 201 is a 300 µm square semiconductor chip.

Since a greater number of wavelengths are selectable in the surface-emitting laser element 200 according to the second embodiment, yield rates may be improved. Further, in the surface-emitting laser element 200 according to the second embodiment, the surface-emitting laser emitting the second closest wavelength may be utilized as a spare in addition to the surface-emitting laser emitting the first closest wavelength, and hence, the life-span of the surface-emitting laser element 200 may be increased.

Note that other configurations and features of the surface-emitting laser element 200 according to the second embodiment are similar to those of the surface-emitting laser element 10 according to the first embodiment.

Third Embodiment

Figure 9:
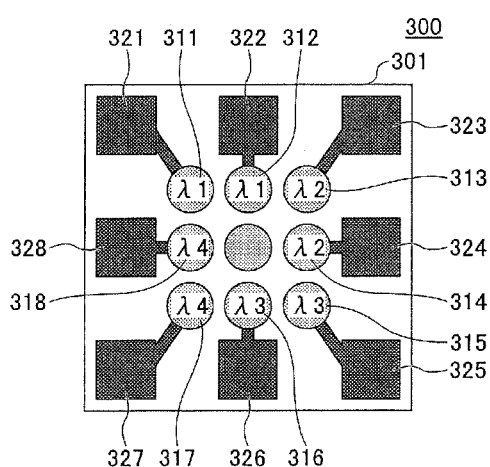
FIG. 9 is a top diagram illustrating a surface-emitting laser element according to a third embodiment.

Next, a third embodiment is described. A surface-emitting laser element 300 according to a third embodiment is described with reference to FIG. 9. The surface-emitting laser element 300 according to the third embodiment includes eight surface-emitting lasers formed on a substrate 301, and the eight surface-emitting lasers are four sets of two surface-emitting lasers, each set configured to emit laser beams of the same wavelength.

Specifically, the surface-emitting laser element 300 according to the third embodiment includes a first surface-emitting laser 311, a second surface-emitting laser 312, a third surface-emitting laser 313, a fourth surface-emitting laser 314, a fifth surface-emitting laser 315, a sixth surface-emitting laser 316, a seventh surface-emitting laser 317 and a eighth surface-emitting laser 318 formed on the substrate 301. The first surface-emitting laser 311 to the eighth surface-emitting laser 318 are connected to respective electrode pads. Specifically, in the surface-emitting laser element 300, the first surface-emitting laser 311 is connected to an electrode pad 321, the second surface-emitting laser 312 is connected to an electrode pad 322, the third surface-emitting laser 313 is connected to an electrode pad 323, the fourth surface-emitting laser 314 is connected to an electrode pad 324, the fifth surface-emitting laser 315 is connected to an electrode pad 325, the sixth surface-emitting laser 316 is connected to an electrode pad 326, the seventh surface-emitting laser 317 is connected to an electrode pad 327 and the eighth surface emitting laser 318 is connected to an electrode pad 328.

The first surface-emitting laser 311 to the eighth surface-emitting laser 318 are composed of four sets of the two surface-emitting lasers, each set emitting the laser beam of the same wavelength. Specifically, the first surface-emitting laser 311 and the second surface-emitting laser 312 are configured to emit the laser beam having the wavelength $\lambda 1$, the third surface-emitting laser 313 and the fourth surface-emitting laser 314 are configured to emit the laser beam having the wavelength $\lambda 2$, the fifth surface-emitting laser 315 and the sixth surface-emitting laser 316 are configured to emit the laser beam having the wavelength $\lambda 3$, and the seventh surface-emitting laser 317 and the eighth surface-emitting laser 318 are configured to emit the laser beam having the wavelength $\lambda 4$. The wavelengths $\lambda 1$ to $\lambda 4$ are different from one another. In the surface-emitting laser element 300 according to the third embodiment, the wavelength-adjusting layer is formed such that the thicknesses of the wavelength-adjusting layer is changed (adjusted) corresponding to the four sets of the surface-emitting lasers to emit laser beams of different wavelengths. Note that the size of each of the electrode pads 321 to 328 is an approximately 50 μm square and the substrate 301 is a 300 μm square semiconductor chip.

The surface-emitting laser element 300 according to the third embodiment includes sets of two surface-emitting lasers each set emitting the laser beam of the same wavelength. Accordingly, even if one of the two surface-emitting lasers emitting the laser beams of the same wavelengths is incapable of emitting a laser beam due to its defect or damage, the other one may be utilized in place of the damaged one. Thus, the life-span of the surface-emitting laser element 300 according to the third embodiment may be increased and the yield rates may be improved. Further, in the surface-emitting laser element 300 according to the third embodiment, the surface-emitting laser emitting the second closest wavelength may be utilized as a spare in addition to the surface-emitting laser emitting the first closest wavelength, and hence, the life-span of the surface-emitting laser element 300 may be increased.

Note that other configurations and features of the surface-emitting laser element 300 according to the third embodiment are similar to those of the surface-emitting laser element 10 according to the first embodiment.

Fourth Embodiment

Figure 10:
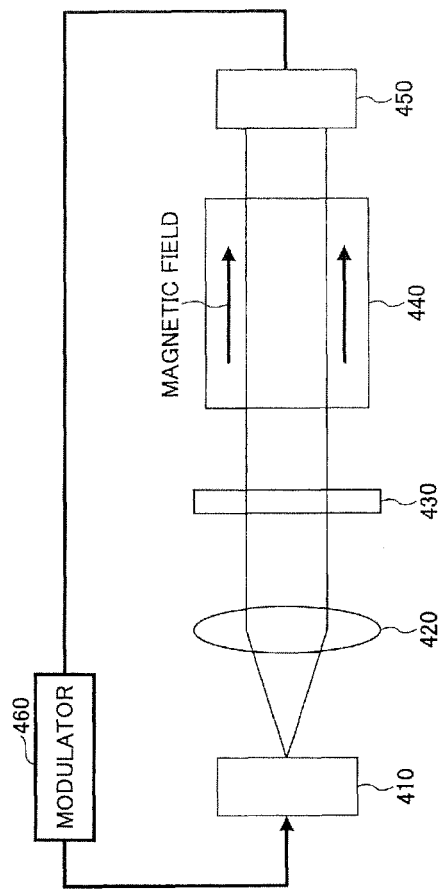
FIG. 10 is structural diagram illustrating an atomic oscillator according to a fourth embodiment.

Next, a fourth embodiment is described. The fourth embodiment illustrates an atomic oscillator including the surface-emitting laser element according to the first to the third embodiments. The atomic oscillator according to the fourth embodiment is described with reference to FIG. 10. The atomic oscillator according to the fourth embodiment is a compact size CPT-based atomic oscillator including a light source 410, a collimate lens 420, a $\lambda/4$ wave plate 430, an alkali metal cell 440, a photodetector 450 and a modulator 460.

The light source 410 is formed of the surface-emitting laser elements according to the first to the third embodiments. The alkali metal cell 440 encapsulates a cesium (Cs) atomic gas as alkali metal and hence, the surface-emitting laser elements utilize the transition of the D1-line of the alkali metal (i.e., Cs). The photodetector 450 is formed of a photodiode.

In the atomic oscillator according to the fourth embodiment, an electron in the cesium (Cs) atom is excited by applying the light beam from the light source 410 to the alkali metal cell 440 encapsulating the cesium (Cs) atomic gas. The light beam passed through the alkali metal cell 440 is detected by the photodetector 450 as a signal, the detected signal is fed back to the modulator 460, and the modulator 460 modulates the surface-emitting laser element forming the light source 410.

Figure 11:
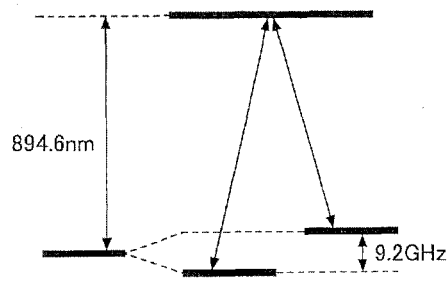
FIG. 11 is an explanatory diagram illustrating an atomic energy level in a CPT-based atomic oscillator.
Figure 12:
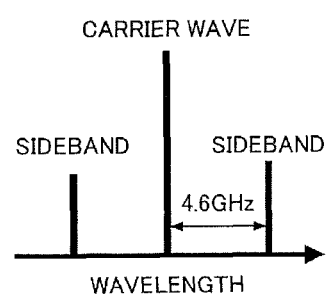
FIG. 12 is an explanatory diagram illustrating an output wavelength of the surface-emitting laser when the surface-emitting laser is modulated.
Figure 13:
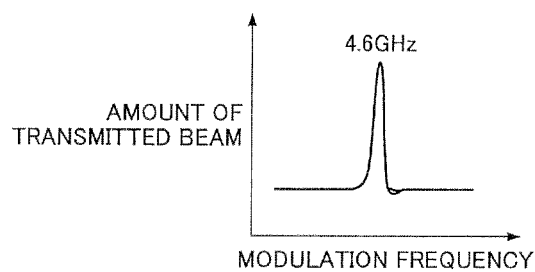
FIG. 13 is a correlation diagram illustrating a relationship between a modulation frequency and an amount of transmitted laser beam.

FIG. 11 illustrates a structure of an atomic energy level associated with a coherent population trapping (CPT) technique. The CPT technique utilizes a phenomenon of light absorption being reduced when electrons are simultaneously excited from two ground levels to an excitation level. The surface-emitting laser having a wavelength of a carrier wave close to 894.6 nm is selected. The wavelength of the carrier wave may be tuned by changing a temperature or an output of the surface-emitting laser. The wavelength of the carrier wave may be shifted to a longer wavelength when changing the temperature or the output of the surface-emitting laser. It is preferable to utilize the temperature change because a fluctuation in light density of the alkali metal cell is undesirable. Specifically, the temperature dependency of the wavelength may be adjusted by approximately 0.05 nm/° C. As illustrated in FIG. 12, the modulation of the laser beam produces sidebands on two sides of the carrier wave, and the frequency difference between the sidebands is modulated by 4.6 GHz so as to match the natural frequency of cesium (Cs) atoms of 0.2 GHz. As illustrated in FIG. 13, the amount of the laser beam passing through the excited Cs gas reaches the maximum when the frequency difference between the sidebands matches the natural frequency of the Cs atoms. Thus, the laser beam passing through the excited Cs gas is fed back to the modulator 460 to adjust the modulation frequency of the laser beam of the surface-emitting laser element in the light source 410 such that the output of the photodetector 450 maintains the maximum value. Since the natural frequency of the Cs atoms is extremely stable, the modulation frequency maintains a stable value and this information is obtained through its output. Note that if the wavelength is 894.6 nm, the light source may need to emit a light beam with an allowable range of ±1 nm of the wavelength. That is, the light source may need to emit the light beam in a range of 893.6 to 895.6 nm.

Since the atomic oscillator according to the fourth embodiment includes the surface-emitting laser elements according to the first to the third embodiments, the atomic oscillator may be fabricated at low cost. Further, if the atomic oscillator according to the fourth embodiment incorporates the surface-emitting laser elements according to the second and the third embodiments, the atomic oscillator having a longer life-span may be provided.

Further, the atomic oscillator according to the fourth embodiment utilizes cesium (Cs) as alkali metal and the surface-emitting laser emitting the laser beam with the wavelength of 894.6 nm for utilizing the transition of the D1-line of the alkali metal (i.e., Cs). However, if the surface-emitting laser utilizes the transition of the D1-line of Cs, the surface-emitting laser emitting the laser beam with the wavelength of 852.3 nm may be utilized. Further, rubidium (Rb) may be utilized as alkali metal. In this case, the surface-emitting laser emitting the laser beam with the wavelength of 795.0 nm may be utilized for the transition of the D1-line of Rb and the surface-emitting laser emitting the laser beam with the wavelength of 780.2 nm may be utilized for the transition of the D2-line of Rb. The material composition of the active layer may be designed based on the wavelengths. Moreover, the modulation frequency for Rb may be 3.4 GHz for 87 Rb and 1.5 GHz for 85 Rb. Note that, the light source may need to emit the light beam in a range of ±1 nm of the wavelength. That is, the light source may need to emit the light beam having a wavelength in a range of 851.3 to 853.3 nm when utilizing the transition of the D2-line of Cs. Likewise, the light source may need to emit the light beam having a wavelength in a range of 794.0 to 796.0 nm when utilizing the transition of the D1-line of Rb. Further, the light source may need to emit the light beam having a wavelength in a range of 779.0 to 781.2 nm when utilizing the transition of the D1-line of Rb.

The embodiments of the present invention have been described heretofore for the purpose of illustration; however, the present invention is not limited to these embodiments. Further, the fourth embodiment has described a case where the atomic oscillator incorporates the surface-emitting laser elements according to the first to the third embodiments; however, the surface-emitting laser elements according to the first to the third embodiments may be utilized in various other devices that may require light with predetermined wavelength such as a gas sensor. In such cases, these devices may exhibit similar effects by incorporating the surface-emitting laser elements according to the first to the third embodiments emitting predetermined wavelengths varied with the purpose of application.

According to the embodiments described above, the surface-emitting laser element having the surface-emitting lasers emitting at the desired wavelengths may be fabricated at low cost. Further, according to the embodiments described above, the high precision atomic oscillator may be fabricated at low cost.

Embodiments of the present invention have been described heretofore for the purpose of illustration. The present invention is not limited to these embodiments, but various variations and alterations may be made without departing from the scope of the present invention. The present invention should not be interpreted as being limited to the embodiments that are described in the specification and illustrated in the drawings.

The present application is based on Japanese Priority Application No. 2011-059137 filed on Mar. 17, 2011, and Japanese Priority Application No. 2011-255532 filed on Nov. 22, 2011, with the Japanese Patent Office, the entire contents of which are hereby incorporated by reference.

The invention claimed is:

1. A surface-emitting laser device, comprising:
  plural surface-emitting laser elements configured to emit laser beams of different wavelengths, wherein each of the surface-emitting laser elements includes:
    an active layer;
    an upper reflector and a lower reflector sandwiching the active layer; and
    a wavelength adjusting layer formed closer to the light emitting side than the active layer, wherein
  each of the wavelength-adjusting layers included in the surface-emitting laser elements has a different number of semiconductor layers, and wherein
  each of the semiconductor layers is any one of (a) a combination of GaInP and GaAsP, and (b) a combination of GaInP and GaAs.

2. The surface-emitting laser element as claimed in claim 1, wherein
  the wavelength-adjusting layer includes one of
    a first film having alternately layered GaInP and GaAsP and
    a second film having alternately layered GaInP and GaAs,
  the thickness of the wavelength-adjusting layer being changed by partially removing each of the alternating layers of a corresponding one of the first and second films, and the one of the first and second films is partially removed by wet etching, and
  a first etching solution utilized for wet etching the GaInP and a second etching solution utilized for wet etching the GaAsP or the GaAs are different from each other.

3. The surface-emitting laser element as claimed in claim 1, wherein the GaInP includes a composition that exhibits compression strain.

4. A method for testing a surface-emitting laser element for use in an atomic oscillator, the surface-emitting laser element including a lower DBR, an active layer, an upper DBR, a wavelength-adjusting layer, and surface-emitting lasers emitting respective laser beams having different wavelengths by changing a thickness of the wavelength-adjusting layer, the method comprising:
  causing the plurality of surface-emitting lasers of the surface-emitting laser element to sequentially emit laser beams based on an operation condition set in advance;
  measuring the respective wavelengths of the laser beams emitted from the surface-emitting lasers; and
  selecting one of the surface-emitting lasers emitting a wavelength closest to a predetermined wavelength.

5. A surface-emitting laser element comprising:
  plural surface-emitting laser elements configured to emit laser beams of different wavelengths, wherein each of the surface-emitting laser elements includes:
    an active layer;
    an upper reflector and a lower reflector sandwiching the active layer; and
    a wavelength adjusting layer formed closer to the light emitting side than the active layer, wherein
  each of the wavelength-adjusting layers included in the surface-emitting laser elements has a different number of semiconductor layers,
  each of the semiconductor layers is any one of (a) a combination of GaInP and GaAsP, and (b) a combination of GaInP and GaAs, and wherein
  a contact layer connected to an electrode is formed between the active layer and the wavelength-adjusting layer.

6. The surface-emitting laser element as claimed in claim 5, wherein the contact layer is formed of a material containing GaAs.

7. The surface-emitting laser element as claimed in claim 5, wherein at least a part of the upper reflector is formed by alternately layering dielectric films having different refractive indices.

8. The surface-emitting laser element as claimed in claim 5, wherein the dielectric films include an oxide, a nitride and a fluoride.

9. The surface-emitting laser element as claimed in claim 5, wherein each of the surface-emitting lasers is configured to emit a laser beam having a wavelength differing from the wavelengths of the laser beams emitted from the rest of the surface-emitting lasers.

10. The surface-emitting laser element as claimed in claim 5, wherein two or more of the surface-emitting lasers are configured to emit laser beams having same wavelengths.

11. The surface-emitting laser element as claimed in claim 5, wherein one of the wavelengths of the laser beams emitted from the surface-emitting lasers falls within one of a range of 893.6 to 895.6 nm, a range of 851.3 to 853.3 nm, a range of 794.0 to 796.0 nm, and a range of 779.2 to 781.2 nm.

12. The surface-emitting laser element as claimed in claim 5, wherein the active layer includes GaInAs.

13. The surface-emitting laser element as claimed in claim 5, wherein
the substrate is a semiconductor crystal substrate that exhibits conductivity, and
each of the lower reflector, the active layer, and the wavelength-adjusting layer is formed by epitaxially growing a semiconductor material.

14. An atomic oscillator comprising:
the surface-emitting laser element as claimed in claim 5;
an alkali metal cell encapsulating alkali metal; and
a photodetector configured to detect light beams having passed through the alkali metal cell, the light beams applied to the alkali metal cell being emitted from the surface-emitting lasers of the surface-emitting laser element, wherein
the light beams emitted from the surface-emitting lasers include sidebands and two of the light beams that have different wavelengths are applied to the alkali metal cell such that an oscillation frequency is controlled by light absorption properties due to a quantum interference effect of two kinds of resonant light.

15. The atomic oscillator as claimed in claim 14, wherein the two of the light beams having different wavelengths are both the light beams having the sidebands emitted from the surface-emitting lasers.

16. The atomic oscillator as claimed in claim 14, wherein the alkali metal is one of rubidium and cesium.

17. The surface-emitting laser element as claimed in claim 5, wherein the wavelength-adjusting layer includes one of a first film having alternately layered GaInP and GaAsP and a second film having alternately layered GaInP and GaAs, the thickness of the wavelength-adjusting layer being changed by partially removing each of the alternating layers of a corresponding one of the first and second films.

18. The surface-emitting laser element as claimed in claim 17, wherein
the one of the first and second films is partially removed by wet etching, and
a first etching solution utilized for wet etching the GaInP and a second etching solution utilized for wet etching the GaAsP or the GaAs are different from each other.

19. The surface-emitting laser element as claimed in claim 17, wherein the GaInP includes a composition that exhibits compression strain.

* * * * *